United States Patent
Inoue et al.

(10) Patent No.: US 6,630,767 B2
(45) Date of Patent: Oct. 7, 2003

(54) SURFACE ACOUSTIC WAVE DEVICE WITH IMPROVED ELECTRODE

(75) Inventors: Kazuhiro Inoue, Moriyama (JP); Masanobu Watanabe, Kanazawa (JP); Osamu Nakagawara, Shiga-ken (JP); Masahiko Saeki, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 5 days.

(21) Appl. No.: 09/902,819

(22) Filed: Jul. 11, 2001

(65) Prior Publication Data

US 2002/0008437 A1 Jan. 24, 2002

(30) Foreign Application Priority Data

| Jul. 14, 2000 | (JP) | ................................. 2000-214083 |
| Jan. 30, 2001 | (JP) | ................................. 2001-021048 |
| Apr. 25, 2001 | (JP) | ................................. 2001-127009 |

(51) Int. Cl.$^7$ .................. H01L 41/047; H01L 41/16
(52) U.S. Cl. ................ 310/313 A; 310/313 R; 310/363
(58) Field of Search .................. 310/313 A, 313 R, 310/363

(56) References Cited

U.S. PATENT DOCUMENTS

| 5,436,471 A | * | 7/1995 | Hoko ............................ 257/31 |
| 5,955,825 A | * | 9/1999 | Uno ............................. 310/360 |
| 6,190,634 B1 | * | 2/2001 | Lieber et al. ................ 423/439 |
| 6,339,277 B1 | * | 1/2002 | Iwamoto et al. ......... 310/313 R |

FOREIGN PATENT DOCUMENTS

| EP | 0 940 914 A1 | 9/1999 |
| JP | 03-048511 | 3/1991 |
| JP | 07-162255 | 6/1995 |

* cited by examiner

Primary Examiner—Michael C. Zarroli
(74) Attorney, Agent, or Firm—Keating & Bennett, LLP

(57) ABSTRACT

A surface acoustic wave device includes a piezoelectric substrate made of a $LiNO_3$ or $LiTaO_3$ single crystal, and an electrode having power endurance. After a damaged layer formed on a surface of the piezoelectric substrate is removed, an under-electrode layer including at least one of Ti and Cr as a main component is formed by a vacuum deposition process at a temperature of about 100° C. or less, and an Al electrode layer including Al or an Al main component is then formed on the under-electrode layer. The Al electrode layer has a twin crystal structure in which the Al crystal is oriented in a desired direction such that the (111) crystal plane of Al substantially coincides with the Z crystal direction of the piezoelectric substrate.

19 Claims, 4 Drawing Sheets

SURFACE ACOUSTIC WAVE DEVICE WITH IMPROVED ELECTRODE

BACKGROUND OF THE INVENTION

1. Field of the Invention

The present invention relates to a surface acoustic wave device, such as a surface acoustic wave resonator or a surface acoustic wave filter, and a method of manufacturing the same, and more particularly, the present invention relates to the structure of and a method of forming an electrode of a surface acoustic wave device.

2. Description of the Related Art

A conventional surface acoustic wave device is an electronic device utilizing a surface acoustic wave in which the propagation of mechanical vibration energy is concentrated near a solid surface. The surface acoustic wave device generally includes a piezoelectric substrate having piezoelectricity, and an electrode such as an interdigital electrode and/or a grating electrode, which is provided on the piezoelectric substrate, for applying an electrical signal.

Such a surface acoustic wave device generally includes an Al electrode material having low electrical resistivity and a low specific gravity, or an Al alloy composed of Al as a main component.

However, Al has low resistance to stress migration, and thus the supply of high electric power causes hillocks or voids in the electrode, resulting in the occurrence of a short-circuit or disconnection in the electrode. This leads to damage to the surface acoustic wave device in many instances.

To solve the above-described problem, a conventional method is disclosed in Japanese Unexamined Patent Publication Application No. 7-162255 (hereinafter "first prior art"), in which crystal orientation is improved by using an ion beam sputtering process as an electrode forming process to improve power endurance. Another method is disclosed in Japanese Unexamined Patent Publication Application No. 3-48511 (hereinafter "second prior art"), in which a crystal is oriented in a desired direction by epitaxial growth of Al to improve power endurance.

However, the first prior art has insufficient power endurance for application to a radio frequency and high electric power.

The second prior art is applicable only to a quartz substrate, and thus causes difficulties in obtaining an epitaxial film with good crystallinity on a $LiNbO_3$ or $LiTaO_3$ substrate which has high piezoelectricity and is widely used for a filter, and other piezoelectric devices.

SUMMARY OF THE INVENTION

To overcome the above-described problems, preferred embodiments of the present invention provide a surface acoustic wave device including a piezoelectric substrate, and an electrode provided on the piezoelectric substrate, wherein the electrode has a twin crystal structure.

Also, other preferred embodiments of the present invention provide a surface acoustic wave device including a piezoelectric substrate, and an electrode provided on the piezoelectric substrate, wherein the electrode includes Al or an Al alloy including Al as a main component, and exhibits six-fold symmetry spots in a XRD pole figure.

In this surface acoustic wave device, the electrode preferably includes an Al electrode layer made of Al or an Al main component, the Al electrode layer having a crystal orientated in a desired direction such that the normal direction of a (111) crystal plane of Al substantially coincides with the Z crystal axis of the piezoelectric substrate.

In a further preferred embodiment of the present invention, a surface acoustic wave device includes a piezoelectric substrate made of a $LiNbO_3$ or $LiTaO_3$ single crystal, and an electrode provided on the piezoelectric substrate, wherein the electrode does not necessarily have a twin crystal structure. In the present invention, the electrode may include an Al electrode layer including Al as a main component, the Al electrode layer having a crystal orientated in a desired direction such that the normal direction of a (111) crystal plane of Al substantially coincides with the Z crystal axis of the piezoelectric substrate.

The electrode preferably further includes an under electrode layer provided between the Al electrode layer and the piezoelectric substrate, for improving the crystallinity of Al.

The under-electrode layer preferably includes at least one of Ti and Cr as a main component.

In this preferred embodiment of the present invention, the piezoelectric substrate is preferably a 64° Y-X cut $LiNbO_3$ substrate. However, other suitable substrates may be used.

In the surface acoustic wave device of various preferred embodiments of the present invention, with the electrode including the Al electrode layer, an electrically insulating protecting film is further provided to cover the surface and sides of the Al electrode layer.

In a further preferred embodiment of the present invention, a method of manufacturing a surface acoustic wave device is provided which includes a piezoelectric substrate made of a $LiNbO_3$ or $LiTaO_3$ single crystal, and an electrode provided on the piezoelectric substrate and includes an Al electrode layer made of Al or an Al main component, the Al electrode layer having a crystal orientated in a predetermined direction such that the normal direction of a (111) crystal plane of Al substantially coincides with the Z crystal axis of the piezoelectric substrate.

The manufacturing method preferably includes the step of preparing the piezoelectric substrate made of a $LiNbO_3$ or $LiTaO_3$ single crystal, the step of removing a damaged layer from the surface of the piezoelectric substrate, and the step of forming the electrode on the piezoelectric substrate, wherein the electrode forming step includes the step of forming an under-electrode layer made of at least one of Ti and Cr as a main component on the piezoelectric substrate by a vacuum deposition process at a temperature of about 100° C. or less, and the step of forming an Al electrode layer made of Al or an Al main component on the under-electrode layer.

The manufacturing method preferably uses a 64° Y-X cut $LiNbO_3$ substrate. However, other suitable substrates may be used.

Other features, steps, elements, characteristics and advantages of the present invention will become more apparent from the following detailed description of preferred embodiments with reference to the attached drawings.

DETAILED DESCRIPTION OF PREFERRED EMBODIMENTS

Figure 1:
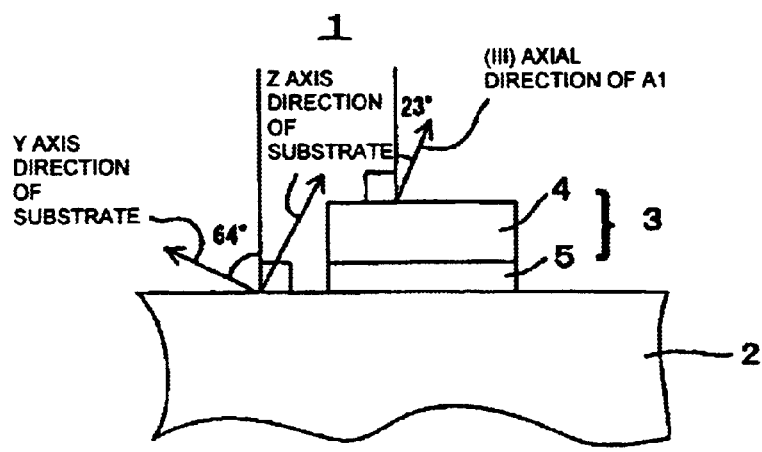
FIG. 1 is a sectional view showing a portion of a surface acoustic wave device according to a preferred embodiment of the present invention.

FIG. 1 is a sectional view showing a portion of a surface acoustic wave device 1 according to a preferred embodiment of the present invention, in which an electrode 3 is provided on a piezoelectric substrate 2.

The piezoelectric substrate 2 is preferably made of a $LiNbO_3$ or $LiTaO_3$ single crystal. The electrode 3 preferably includes an Al electrode layer 4 made of Al or an Al main component, and an under-electrode layer 5 provided between the Al electrode layer 4 and the piezoelectric substrate 2, for improving Al crystallinity. The under-electrode layer 5 is composed of, for example, Ti, or other suitable material.

Although not shown in the drawing, an electric insulating protecting film may be arranged to cover the surface and the side of the Al electrode layer 4.

As the piezoelectric substrate 2, a 64° Y-X cut $LiNbO_3$ substrate is preferably used. The Y-axis direction and the Z-axis direction of the piezoelectric substrate 2 are respectively shown by arrows in FIG. 1. The X-axis direction is substantially perpendicular to the figure.

To form the electrode 3 on the piezoelectric substrate 2, for example, ion etching is performed as pre-treatment. This is performed to remove a damaged layer having a thickness of several nm and performed on the surface of the piezoelectric substrate 2 by polishing or other suitable method, thereby exposing a crystal plane which permits epitaxial growth at the surface of the piezoelectric substrate 2.

Figure 3A:
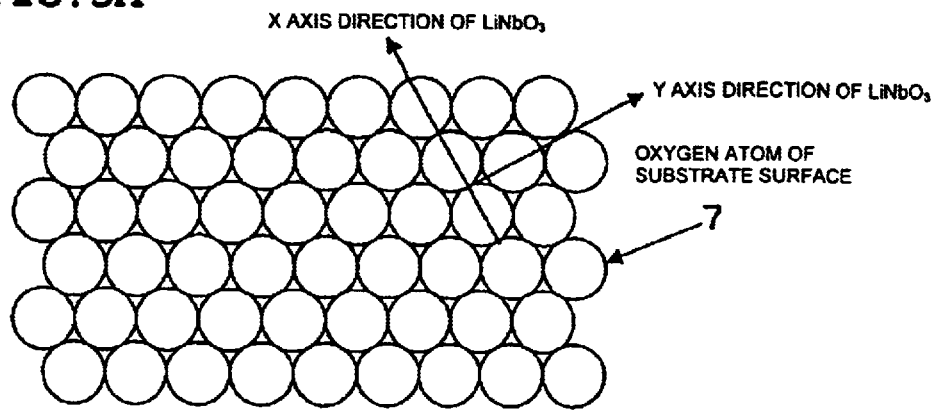
FIG. 3A is a plan view schematically showing oxygen atoms arranged on the Z surface shown in FIG. 2.

As a result of the removal of the damaged layer as described above, the surface of the piezoelectric substrate 2 has a micro-stepped structure including Z surfaces 6 defining terraces. The top of each of the Z surfaces 6 is in a state in which oxygen atoms 7 are arranged at intervals of about 0.297 nm, for example, as schematically shown by white circles in FIG. 3A.

Next, the under-electrode layer 5 is deposited on the Z surfaces 6 of the piezoelectric substrate 2 on which the oxygen atoms 7 are arranged as described above. To form the under-electrode layer 5, for example, Ti having a hexagonal close-packed structure with a minimum interatomic spacing of about 0.292 nm is preferably deposited. In this case, Ti is epitaxially grown such that the (001) crystal plane of Ti atoms 8 is substantially parallel to the Z surfaces 6 of the piezoelectric substrate 2, as schematically shown by heavily shadowed circles in FIG. 3B.

Figure 3B:
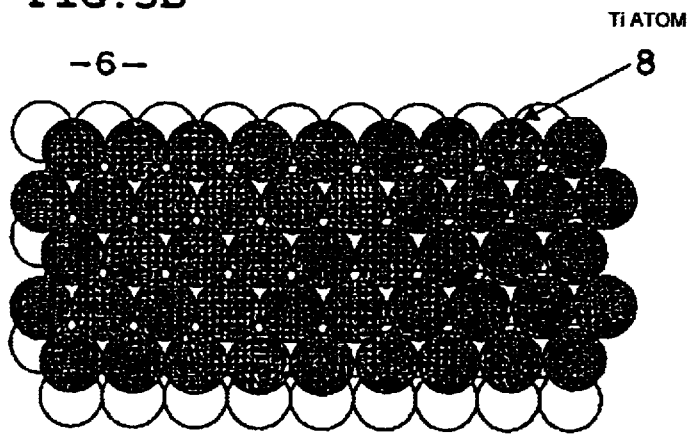
FIG. 3B is a plan view schematically showing Ti atoms arranged on the Z surface.

As shown in FIG. 3B, the minimum interatomic spacing of the Ti atoms 8 is substantially the same as that of the oxygen atoms 7 arranged on the Z surfaces 6 of the $LiNbO_3$ piezoelectric substrate 2, wherein a Ti thin film having high crystallinity is obtained.

The Ti atoms 8 easily combine with the oxygen atoms 7, and the minimum interatomic spacing of the Ti atoms 8 is closer to the oxygen atoms 7 on the $LiNbO_3$ substrate defining the piezoelectric substrate 2 than the minimum interatomic spacing of Al. Therefore, sufficient crystallinity is obtained, as compared with direct deposition of the Al electrode layer 4 on the piezoelectric substrate 2, which will be described below. FIG. 3B shows the atomic arrangement of the Ti atoms 8 in the (001) plane at the bottom surface of the under-electrode layer 5.

In forming the under-electrode layer 5, a vacuum deposition process is performed at a temperature of about 100° C. or less. In this vacuum deposition process, with a temperature higher than about 100° C., the arrangement direction of the Ti atoms 8 is changed to cause growth of Al during deposition of the Al electrode layer in which the (111) crystal plane or (110) crystal plane of Al is substantially perpendicular to the piezoelectric substrate 2, thereby failing to obtain good crystallinity.

Next, the Al electrode layer 4 is formed on the under-electrode layer 5. In more detail, Al having a face-centered cubic structure with a minimum interatomic spacing of about 0.286 nm is preferably deposited on the under-electrode layer 5 having an arrangement of the Ti atoms 8 to cause epitaxial growth in which the (111) plane of the Al atoms 9 is substantially parallel to the (001) plane of Ti, as schematically shown by lightly shadowed circles in FIG. 3C.

Figure 3C:
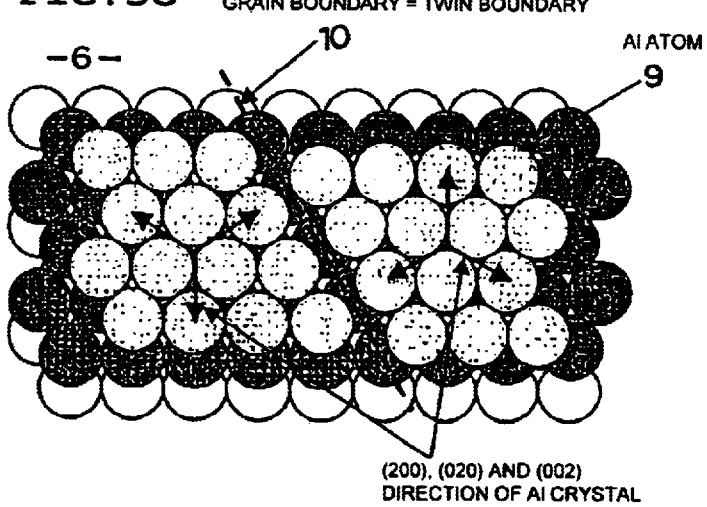
FIG. 3C is a plan view schematically showing Al atoms arranged on the Z surface.

As a result, as shown in FIG. 3C, the crystal structure of the deposited Al electrode layer 4 has two crystal orientations according to the arrangement of the Al atoms 9, which have symmetry of about 180° around a rotational axis parallel to the Z axis direction of the piezoelectric substrate 2. Such a crystal structure is generally referred to as a "twin crystal structure". Each of the two crystal orientations occur with a probability of about ½, and the resultant Al electrode layer 4 includes a polycrystal having crystal boundaries, i.e., twin boundaries, as shown by the bold broken line 10 in FIG. 3C.

Although FIG. 3 shows only one atomic layer of the Ti atoms 8 for the sake of simplification, several atomic layers to several hundreds atomic layers are actually formed.

FIG. 3 shows the (200), (020) and (002) crystal directions of Al via arrows. In fact, these axes do not lie in the drawing of FIG. 3C, but are inclined by about 35° toward the front side of the drawing.

Figure 2:
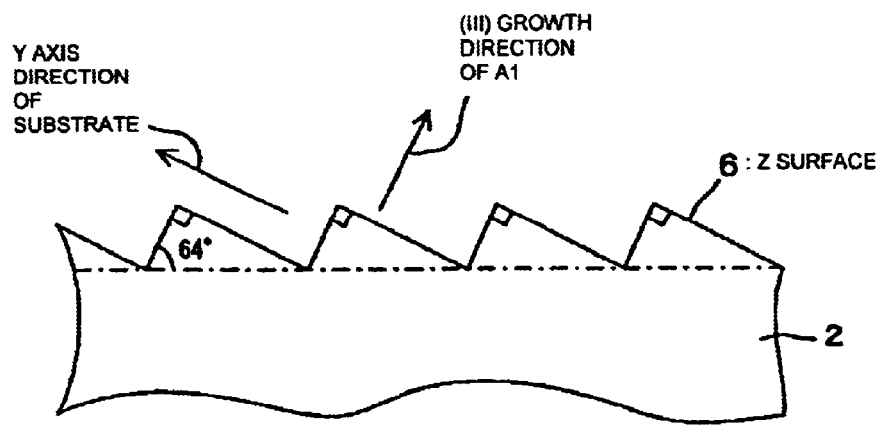
FIG. 2 is a sectional view schematically showing the Z surface of the piezoelectric substrate shown in FIG. 1, which is exposed after removal of a damaged layer from the surface.

In this way, as shown in FIG. 1, the Al electrode layer 4 is obtained on the piezoelectric substrate 2 preferably made of 64° Y-X cut $LiNbO_3$ substrate such that the (111) plane is grown in parallel with the Z surfaces 6 (refer to FIGS. 2 and 3).

It is generally said that the presence of crystal grain boundaries in the Al electrode layer decreases the power endurance of the surface acoustic wave device. This is due to the fact that Al diffuses by itself due to stress migration through the crystal grain boundaries to produce defects referred to as "hillocks" or "voids". However, in the polycrystalline Al electrode layer 4 according to preferred embodiments of the present invention, the crystal grain boundaries are smaller than the interatomic spacing, thereby causing substantially no self-diffusion through the crystal grain boundaries.

On the other hand, the mechanical strength of a single crystal metal is lower than that of a polycrystal metal. This is due to a plastic deformation mechanism of the metal. This is due to the fact that plastic deformation causes crystal slip deformation due to external forces, i.e. oscillation due to a piezoelectric effect in the field of a surface acoustic wave device, and plastic deformation of a single crystal is caused only by an extremely active slipping-system action, while plastic deformation of a polycrystal requires a plurality of slipping-system actions (reference: Maruzen "Kinzoku Binran" fifth revision, pp. 337–343). Therefore, a reduction in plastic deformation produces a reduction in electrode breakage due to stress migration, and thus an electrode structure having a small grain diameter exhibits high resistance to electric power.

Therefore, with the Al electrode layer 4 including an oriented film having a twin crystal structure, the surface acoustic wave device prevents the occurrence of hillocks or voids due to self-diffusion of the electrode constituent atoms through the crystal grain boundaries, and high resistance to electric power due to a reduction in plastic deformation.

Although, in the above-described preferred embodiments, the Al electrode layer 4 includes an oriented film having a twin crystal structure, it is not necessary for the Al electrode layer to have the twin crystal structure when the surface acoustic wave device includes a piezoelectric substrate made of a $LiNbO_3$ or $LiTaO_3$ single crystal. In other words, the Al electrode layer may have either uniaxial orientation or triaxial orientation as long as it includes a crystal orientated in a desired direction such that the normal direction of the (111) crystal plane of Al substantially coincides with the Z crystal axis of the piezoelectric substrate.

Although the above-described preferred embodiment uses the 64° Y-X cut $LiNbO_3$ piezoelectric substrate 2, another substrate having a different cut angle may also be employed because the damaged layer of the surface is removed by pretreatment to expose a crystal plane which permits epitaxial growth. Also, a $LiTaO_3$ substrate having a similar crystal structure produces the same effect, and a substrate other than the $LiNbO_3$ substrate and the $LiTaO_3$ substrate can be used.

Although Al is preferably used as the material for the Al electrode layer 4, an alloy including Al and an additive having the effect of improving power endurance, for example, such as Cu, Mg, Ni, Mo, or other suitable additive may be used.

Although Ti is preferably used as material for the under-electrode layer 5, an alloy including Ti as a main component, a metal having the effect of improving Al crystallinity, for example, Cr, or an alloy including Cr as a main component may be used.

Although ion etching is preferably performed as a pre-treatment of the piezoelectric substrate 2, another method such as chemical-mechanical polishing, scrubber cleaning, or other suitable methods may be used.

EXPERIMENTAL EXAMPLES

To produce a surface acoustic wave filter according to various preferred embodiments of the present invention, ion etching pretreatment was performed on a 64° Y-X cut $LiNbO_3$ piezoelectric substrate to remove a damaged layer on the surface of the substrate having a thickness of several nm.

Next, an under-electrode layer of Ti having a thickness of about 5 nm was formed by an electron beam deposition process at a substrate temperature of about 50° C., and then an Al electrode layer of Al having a thickness of about 200 nm was formed. As a result, the Al electrode layer could be epitaxially grown such that the (111) crystal plane was perpendicular to the Z axis of $LiNbO_3$ of the piezoelectric substrate.

Next, the electrode including the under-electrode layer and the Al electrode layer was processed to have an interdigital shape by a photolithography technique and dry etching technique to obtain an example of a surface acoustic wave filter according to various preferred embodiments of the present invention.

Figure 4:
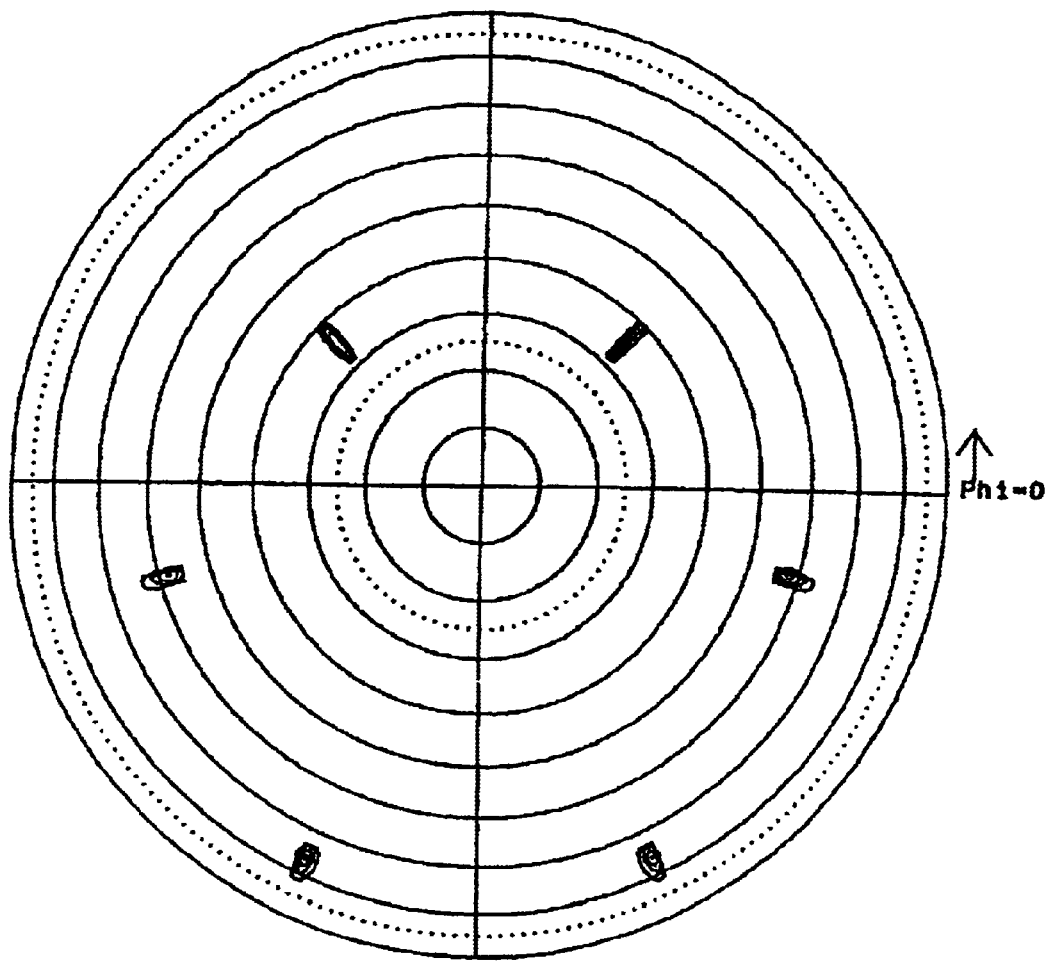
FIG. 4 is a XRD pole figure of an Al electrode layer according to another preferred embodiment of the present invention.

FIG. 4 is a XRD pole figure of the Al electrode layer provided in the electrode of this example. FIG. 4 was obtained by reflection from the (200) plane of Al. The center of the figure corresponds to the normal direction of the substrate. FIG. 4 shows six-fold symmetry spots of the (200) plane of Al with a center inclined at about 23° from the center of the figure.

Therefore, FIG. 1 reveals that the Al electrode layer 4 is epitaxially grown along the Z axis of the piezoelectric substrate 2 such that the (111) axis direction of the Al electrode layer 4 is oriented in a desired direction at about 23° from the normal direction of the piezoelectric substrate 2. Since, as shown in FIG. 4, the detection points of a signal reflected from the (200) plane of Al have six-fold symmetry, and the Al crystal has a crystal structure with two crystal orientations that have symmetry of 180° rotation around the (111) plane of Al. Further, the Al electrode layer exhibits excellent crystallinity.

Figure 5:
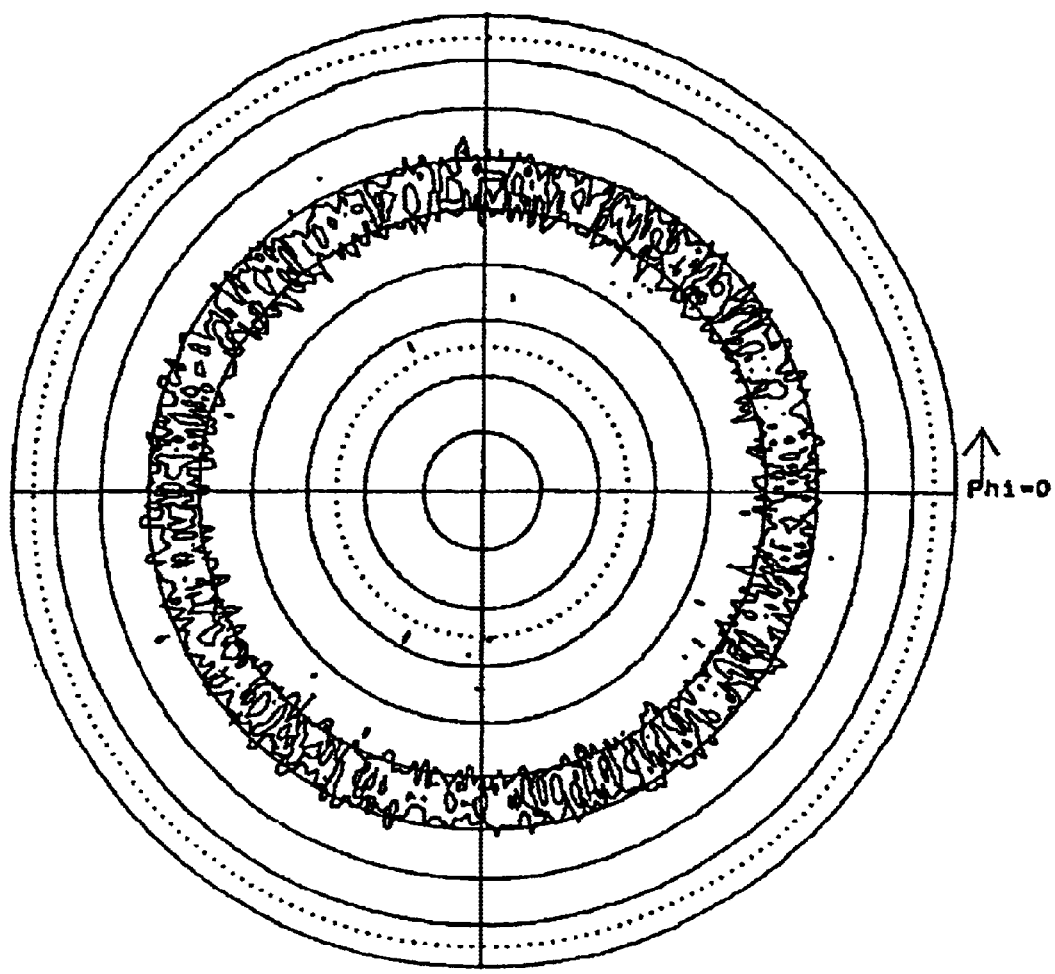
FIG. 5 is a XRD pole figure of an Al electrode layer of a comparative example.

In a comparative example, Ti and Al were deposited at a substrate temperature of 200° C. without ion etching pretreatment, thus, failing to obtain an epitaxial film, but rather, a uniaxially oriented film was obtained in which the (111) plane of Al was grown perpendicularly to the substrate. FIG. 5 is a XRD pole figure of the comparative example. FIG. 5 was obtained by reflection from the (002) plane of Al.

As a result of comparison of power endurance, the surface acoustic wave filter of the example according to preferred embodiments of the present invention took at least 1000 times longer than the surface acoustic wave filter of the comparative example to fail under predetermined electric power.

As described above, a surface acoustic wave device according to various preferred embodiments of the present invention includes an electrode provided on a piezoelectric substrate and having a twin crystal structure. In other words, the electrode including Al or an Al main component and provided on the piezoelectric substrate preferably made of a $LiNbO_3$ or $LiTaO_3$ single crystal shows six-fold symmetry spots in a XRD pole figure. Therefore, the electrode prevents the growth of hillocks or voids in the electrode due to self-diffusion of the constituent atoms of the electrode through crystal grain boundaries, and the power endurance due to a difficulty in plastic deformation is greatly increased. Therefore, the power endurance of the surface acoustic wave device is greatly improved.

With the electrode including an Al electrode layer including Al or an Al main component, the crystal of the Al electrode layer is oriented in a desired direction such that the normal direction of the Al crystal (111) plane substantially coincides with the Z crystal axis of the piezoelectric substrate, thereby effectively suppressing the occurrence of hillocks or voids in the electrode due to the above-described stress migration, and greatly improving the power endurance of the surface acoustic wave device.

In the surface acoustic wave device, an under-electrode layer including at least one of Ti and Cr as a main component may be provided between the Al electrode layer and the piezoelectric substrate. In this case, Al crystallinity of the Al electrode layer is further improved.

The method of manufacturing a surface acoustic wave device includes the steps of preparing a piezoelectric substrate made of a LiNbO$_3$ or LiTaO$_3$ single crystal, removing a damaged layer on the surface of the piezoelectric substrate, and then forming an electrode on the piezoelectric substrate. The electrode forming step includes the step of forming an under-electrode layer including at least one of Ti and Cr as a main component on the piezoelectric substrate by a vacuum deposition process at a temperature of about 100° C. or less, and the step of forming an Al electrode layer including Al or an Al main component on the under-electrode layer. Therefore, an Al electrode layer is produced which prevents the growth of hillocks or voids due to self diffusion of the electrode constituent atoms through crystal grain boundaries, and which greatly improves power endurance due to a difficulty in plastic deformation, thereby obtaining a surface acoustic wave device having greatly improved power endurance.

This manufacturing method preferably uses a 64° Y-X cut LiNbO$_3$ piezoelectric substrate, providing crystal orientation in a desired direction in which the normal direction of the Al crystal (111) plane of the Al electrode layer substantially coincides with the Z crystal axis of the piezoelectric substrate.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device comprising:
   a piezoelectric substrate; and
   an electrode provided on the piezoelectric substrate; wherein
   the electrode has a twin crystal structure and comprises a crystal orientated in a desired direction such that the normal direction of a (111) crystal plane of the crystal substantially coincides with the Z crystal axis of the piezoelectric substrate.

2. A surface acoustic wave device according to claim 1, wherein the electrode comprises an Al electrode layer including Al or an Al main component.

3. A surface acoustic wave device according to claim 2, wherein the electrode further comprises an under-electrode layer provided between the Al electrode layer and the piezoelectric substrate.

4. A surface acoustic wave device according to claim 1, wherein the piezoelectric substrate is a 64° Y-X cut LiNbO$_3$ substrate.

5. A surface acoustic wave device according to claim 2, further comprising an electrically insulating protecting film arranged to cover the surface and sides of the Al electrode layer.

6. A surface acoustic wave device comprising:
   a piezoelectric substrate; and
   an electrode provided on the piezoelectric substrate wherein
   the electrode has a twin crystal structure;
   wherein the piezoelectric substrate is a 64° Y-X cut LiNbO3 substrate.

7. A surface acoustic wave device according to claim 4, wherein the electrode comprises an Al electrode layer including Al or an Al main component, the Al electrode layer comprising a crystal orientated In a desired direction such that the normal direction of a (111) crystal plane of Al substantially coincides with the Z crystal axis of the piezoelectric substrate.

8. A surface acoustic wave device according to claim 7, wherein the electrode further comprises an under-electrode layer provided between the Al electrode layer and the piezoelectric substrate.

9. A surface acoustic wave device according to claim 7, further comprising an electrically insulating protecting film arranged to cover the surface and sides of the Al electrode layer.

10. A surface acoustic wave device comprising:
    a piezoelectric substrate including LiNbO3 or LiTaO3 single crystal; and
    an electrode provided on the piezoelectric substrate and Including Al or an Al main component; wherein
    the electrode exhibits six-fold symmetry spots in a XRD pole figure.

11. A surface acoustic wave device according to claim 10, wherein the electrode comprises an Al electrode layer including Al or an Al main component, the Al electrode layer comprising a crystal orientated in a desired direction such that the normal direction of a (111) crystal plane of Al substantially coincides with the Z crystal axis of the piezoelectric substrate.

12. A surface acoustic wave device according to claim 10, wherein the electrode further comprises an under-electrode layer provided between the Al electrode layer and the piezoelectric substrate.

13. A surface acoustic wave device according to claim 10, wherein the piezoelectric substrate is a 64° Y-X cut LiNbO3 substrate.

14. A surface acoustic wave device according to claim 10, further comprising an electrically insulating protecting film arranged to cover the surface and sides of the Al electrode layer.

15. A surface acoustic wave device comprising:
    a piezoelectric substrate including a LiNbO3 or LiTaO3 single crystal; and
    an electrode provided on the piezoelectric substrate; wherein
    the electrode comprises an Al electrode layer including Al as a main component and comprising a crystal orientated in a desired direction such that the normal direction of a (111) crystal plane of Al substantially coincides with the Z crystal axis of the piezoelectric substrate.

16. A surface acoustic wave device according to claim 15, wherein the electrode further comprises an under-electrode layer provided between the Al electrode layer and the piezoelectric substrate.

17. A surface acoustic wave device according to claim 16, wherein the under-electrode layer includes at least one of Ti and Cr as a main component.

18. A surface acoustic wave device according to claim 15, wherein the piezoelectric substrate is a 64° Y-X cut LiNbO3 substrate.

19. A surface acoustic wave device according to claim 15, further comprising an electrically insulating protecting film arranged to cover the surface and sides of the Al electrode layer.

* * * * *